United States Patent
Ha et al.

(10) Patent No.: US 7,315,293 B2
(45) Date of Patent: Jan. 1, 2008

(54) ORGANIC LIGHT-EMITTING DIODE DISPLAY DEVICE

(75) Inventors: Yong Min Ha, Gumi-si (KR); Jae Ho Sim, Daegu (KR)

(73) Assignee: LG. Philips LCD Co. Ltd., Seoul (KR)

( * ) Notice: Subject to any disclaimer, the term of this patent is extended or adjusted under 35 U.S.C. 154(b) by 0 days.

(21) Appl. No.: 11/319,746

(22) Filed: Dec. 28, 2005

(65) Prior Publication Data

US 2006/0158404 A1    Jul. 20, 2006

(30) Foreign Application Priority Data

Dec. 29, 2004   (KR)   ................... 10-2004-0115729

(51) Int. Cl.
  *G09G 3/32* (2006.01)
(52) U.S. Cl. .................. 345/83; 345/698; 345/98; 345/204; 315/169.3
(58) Field of Classification Search ........... 345/76–78, 345/80, 82–84, 90, 92, 98, 100, 102, 204, 345/698; 315/169.1–169.3
See application file for complete search history.

(56) References Cited

U.S. PATENT DOCUMENTS

| | | | | |
|---|---|---|---|---|
| 6,072,457 A | * | 6/2000 | Hashimoto et al. ......... | 345/100 |
| 6,072,517 A | * | 6/2000 | Fork et al. ................... | 347/237 |
| 6,798,148 B2 | * | 9/2004 | Inukai ....................... | 315/169.3 |
| 6,879,306 B2 | * | 4/2005 | Spoonhower et al. ......... | 345/84 |
| 2003/0174106 A1 | * | 9/2003 | Tanada et al. ................. | 345/83 |
| 2004/0090400 A1 | * | 5/2004 | Yoo ............................ | 345/76 |
| 2005/0057580 A1 | * | 3/2005 | Yamano et al. ............. | 345/690 |
| 2005/0237280 A1 | * | 10/2005 | Oh et al. ....................... | 345/76 |
| 2006/0044245 A1 | * | 3/2006 | Park et al. .................... | 345/92 |

* cited by examiner

*Primary Examiner*—Haissa Philogene
(74) *Attorney, Agent, or Firm*—Brinks Hofer Gilson & Lione

(57) ABSTRACT

An organic light-emitting diode display (OELD) device is presented that reduces the number of outputs of a data driver. The OELD device includes data and scan lines which cross each other. Pixel cells that contain organic electro-luminescence diodes are arranged in a matrix in pixel areas between the data lines and the scan lines. The pixel cells are arranged in different colors in a vertical direction and in the same color in a horizontal direction. A data driver supplies data to the data lines. A scan driver supplies a scan signal to the scan lines.

19 Claims, 5 Drawing Sheets

ORGANIC LIGHT-EMITTING DIODE DISPLAY DEVICE

This application claims the benefit of the Korean Patent Application No. P2004-115729 filed on Dec. 29, 2004, which is hereby incorporated by reference.

1. Technical Field

The present invention relates to an organic light-emitting diode display device, and more particularly to an organic light-emitting diode display device that is adaptive for reducing the number of channels of a data driver, thereby making it easy to connect the data driver to a panel and reducing a manufacturing cost.

2. Description of the Related Art

Recently, various flat panel display devices have been developed. These flat panel display devices have reduced weight and size compared to conventional cathode ray tube devices. Examples of flat display panel devices include liquid crystal displays, field emission displays, plasma display panels, electro-luminescence (hereinafter, referred to as "EL") display devices, etc.

The EL display device is a self-luminous device in which a fluorescent substance emits light by recombining electrons and holes. The EL display device is generally divided into an inorganic EL display device which uses an inorganic compound as the fluorescent substance and an organic EL display device which uses an organic compound as the fluorescent substance. The EL display device is expected to be a next generation display device because the EL display device has many advantages such as low voltage driving, self-luminescence, thinness, wide viewing angle, rapid response speed and high contrast.

FIG. 1 is a cross sectional diagram for explaining an organic light-emitting diode principle of an organic EL display device. The organic light-emitting diode of the organic EL display device includes a cathode 2 formed of a metal having low work function; an anode 14 formed of a transparent conductive material on a substrate; and an electron injection layer 4, an electron transport layer 6, a light-emitting layer 8, a hole transport layer 10 and a hole injection layer 12.

If a voltage is applied between the transparent anode 14 and the opaque metal cathode 2, electrons generated from the cathode 2 move to the light-emitting layer 8 through the electron injection layer 4 and the electron transport layer 6.

Similarly, holes generated from the anode 14 move to the light emitting layer 8 through the hole injection layer 12 and the hole transport layer 10.

Accordingly, the electrons and the holes which are supplied from the electron transport layer 6 and the hole transport layer 10 collide with each other and recombine in the light-emitting layer 8 to generate light. This light is emitted to the outside through the anode 14 to display a picture. The brightness of the organic EL display device is proportional to the current flowing between the anode 14 and the cathode 2.

The organic EL display device, as shown in FIG. 2, includes an EL display panel 16 having pixel cells PE which are arranged at each area defined by the crossing of scan lines SL1 to SLn and data lines DL1 to DLm; a scan driver 18 for driving the scan lines SL1 to SLn; and a data driver 20 for driving the data lines DL1 to DLm.

Because integration of the data driver 20 is difficult in the organic EL display device, the number of channels of the data driver 20 and the number of data lines DL1 to DLm correspond one-to-one.

Thus, the related art organic EL display device uses connecting lines that correspond in number to the horizontal resolution×3 RGB for one-to-one connection of the data driver 20 and the data lines DL1 to DLm. Thus, as the horizontal resolution of displays increase, the number of connecting lines likewise increases. As a result, the number of channels of the data driver 20 of the related art organic EL display device increases in response to the increase of the horizontal resolution. This is problematic in that it is difficult to connect a data driver 20 having increased channel number with the data lines DL1 to DLm one-to-one.

SUMMARY

By way of introduction only, an organic light-emitting diode display device according to an aspect of the present invention includes a plurality of data lines and a plurality of scan lines which cross each other; a plurality of pixel cells arranged in a matrix in pixel areas between the data lines and the scan lines, the pixel cells containing organic electro-luminescence diodes, the pixel cells arranged in different colors in a vertical direction and in the same color in a horizontal direction; a data driver operative to supply a data to the data lines; and a scan driver operative to supply a scan signal to the scan lines.

An organic light-emitting diode display device according to another aspect of the present invention includes a display panel which has a plurality of data lines and a plurality of scan lines crossing each other and a plurality of pixel cells arranged in a matrix in pixel areas between the data lines and the scan lines, the pixel cells containing organic electro-luminescence diodes, and the pixel cells arranged in different colors in a vertical direction and in the same color in a horizontal direction.

A driving method of an organic light-emitting diode display device according to another aspect of the present invention includes providing a display panel containing a plurality of data lines, a plurality of scan lines crossing the data lines to form a plurality of pixel cells, the pixel cells containing organic electro-luminescence diodes, the pixel cells arranged in different colors in a vertical direction and in the same color in a horizontal direction; supplying data to the data lines; and supplying a scan signal to the scan lines of the pixel cells.

BRIEF DESCRIPTION OF THE DRAWINGS

Various embodiments of the invention will be apparent from the following detailed description of the embodiments with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 3:
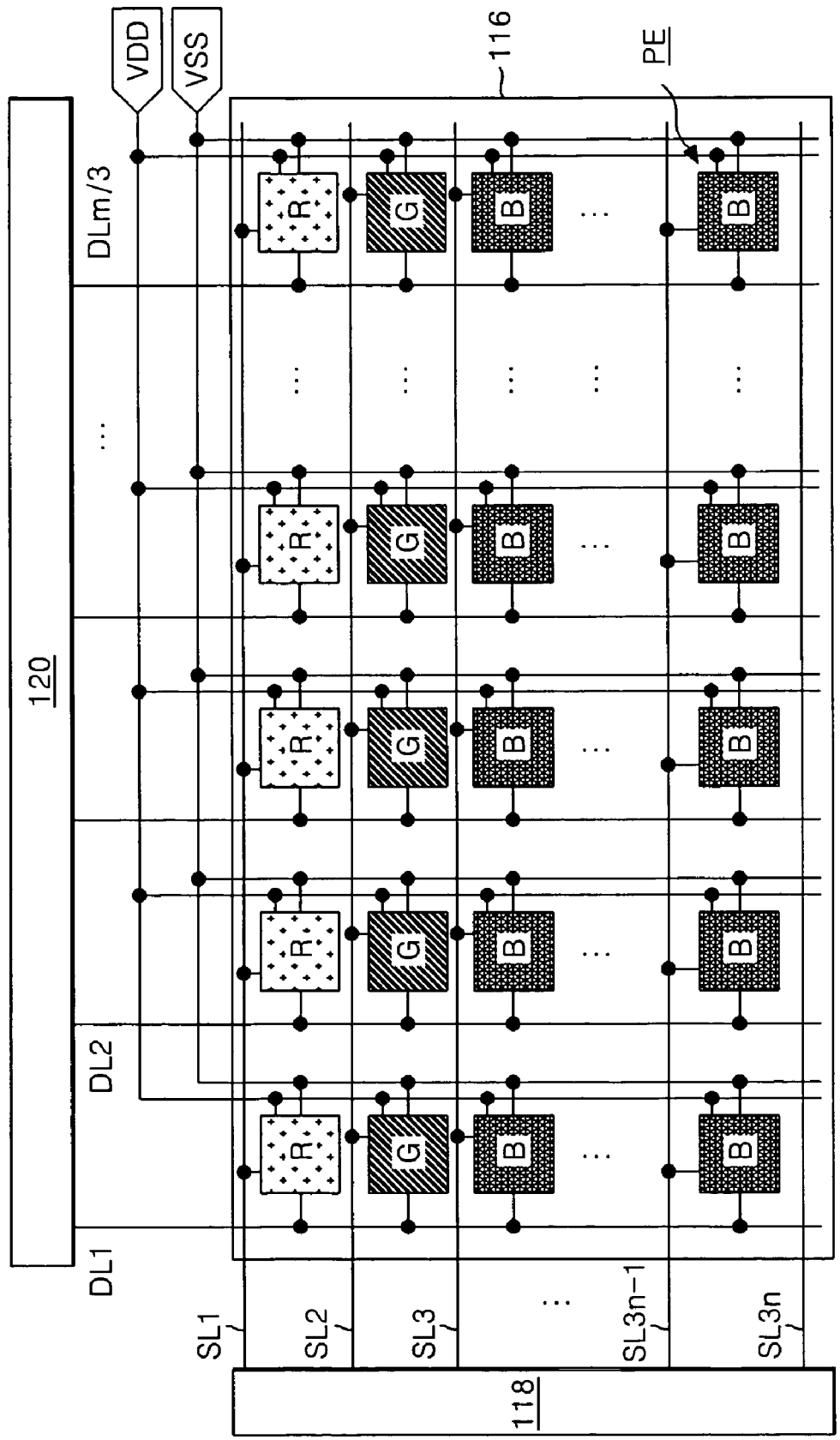
FIG. 3 is a circuit diagram of an organic light-emitting diode display device according to a first embodiment of the present invention.
Figure 4:
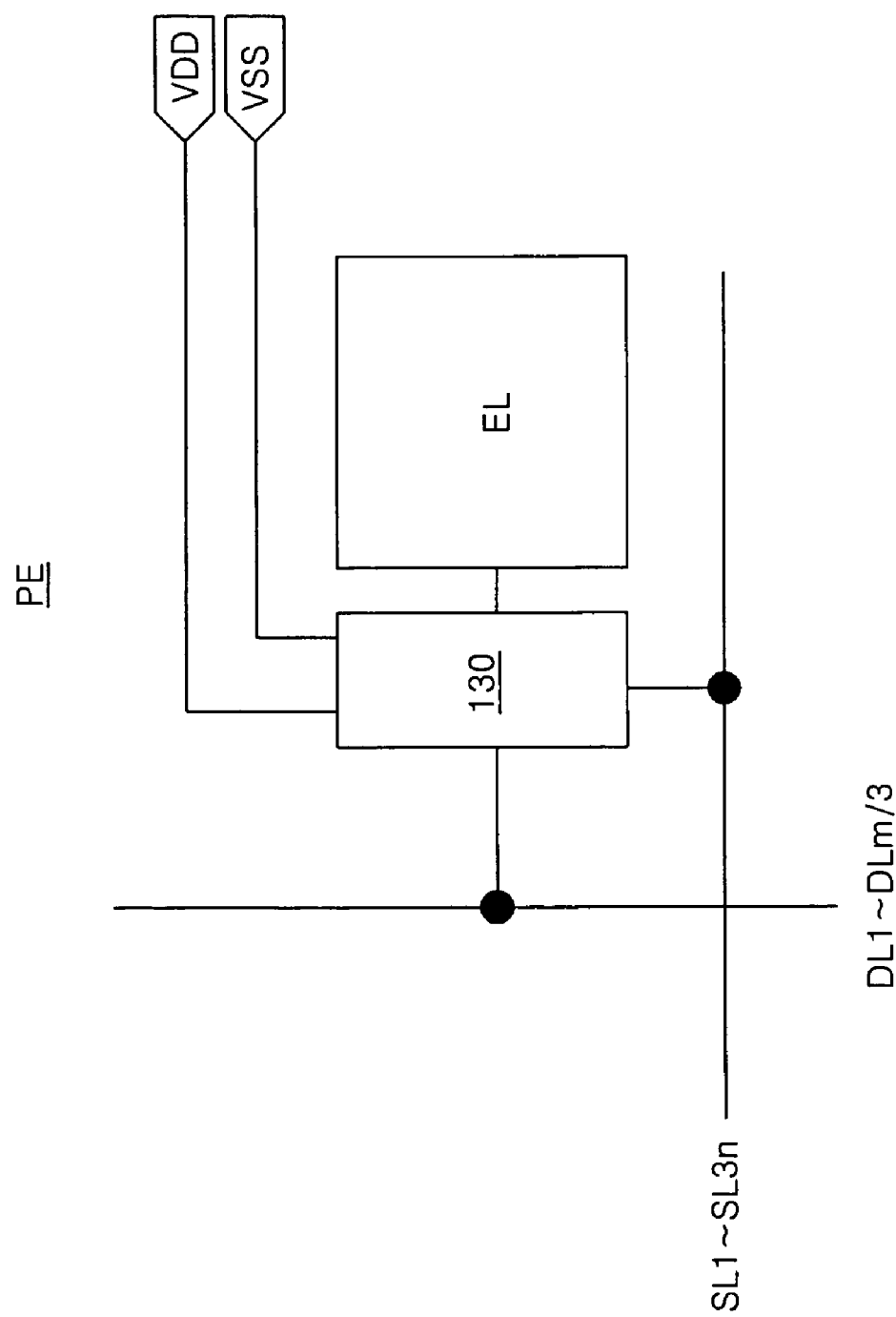
FIG. 4 is a circuit diagram for a pixel cell of FIG. 3.
Figure 5:
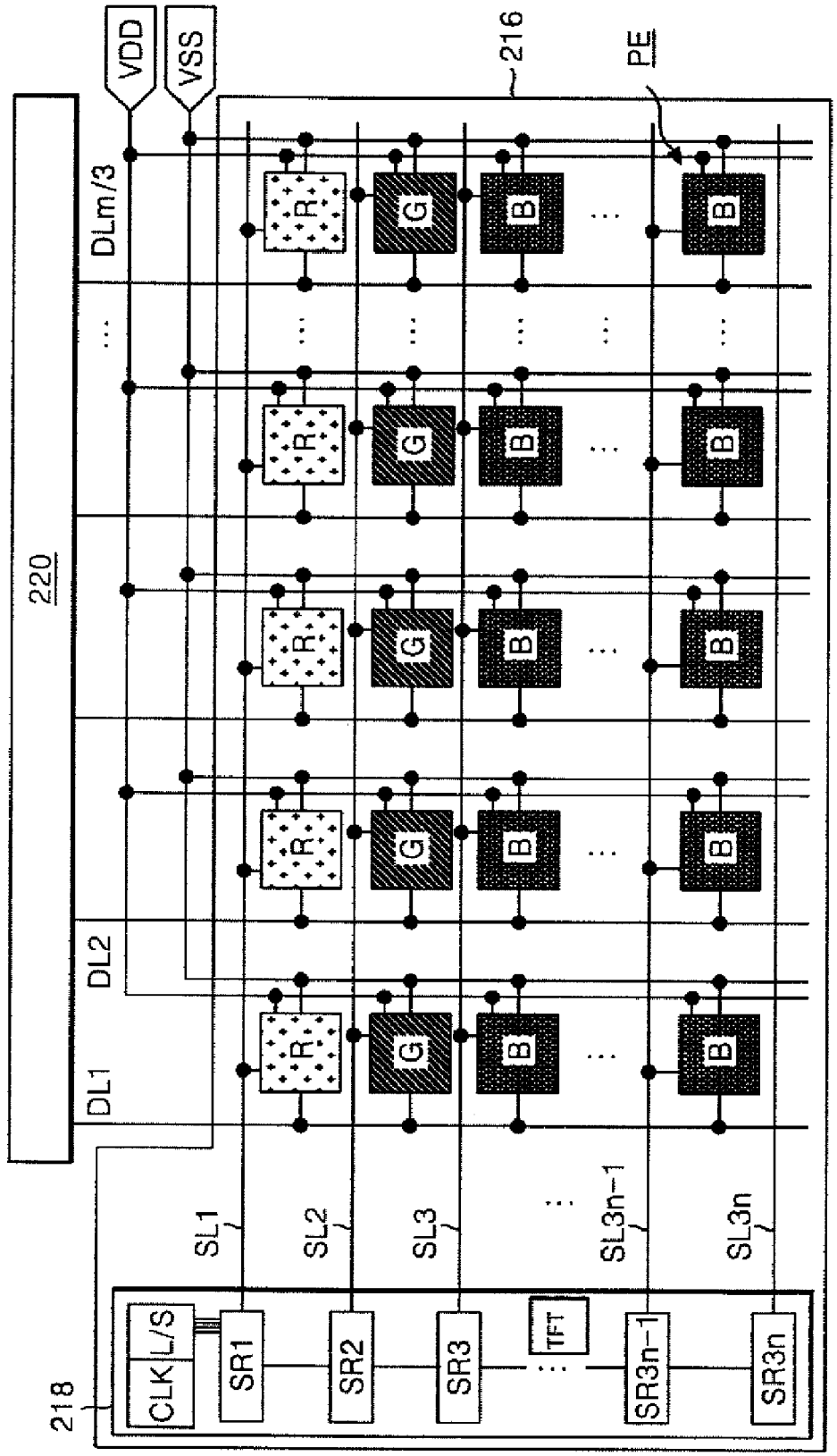
FIG. 5 is a circuit diagram of an organic light-emitting diode display device according to an embodiment of the present invention.

With reference to FIGS. 3 to 5, embodiments of the present invention will be explained as follows.

FIG. 3 is a circuit diagram of an active matrix type organic light-emitting diode display device according to a first embodiment of the present invention.

Referring to FIG. 3, the active matrix type organic light-emitting diode display device according the first embodiment of the present invention includes scan lines SL1 to SL3n to which a scan signal is supplied; data lines DL1 to DLm/3 arranged to cross the scan lines SL1 to SL3n; an EL display panel 116 where RGB pixel cells PE are vertically arranged at each of the crossing areas of the scan lines SL1 to SL3n and the data lines DL1 to DLm/3; a scan driver 118 for driving the scan lines SL1 to SL3n; and a data driver 120 for driving the data lines DL1 to DLm/3.

Each pixel cell PE is arranged in the crossing area of the scan line SL1 to SL3n and the data line DL1 to DLm/3 and emits light in response to a signal from each of the associated gate and data lines, thereby realizing a picture. Specifically, light is emitted in response to negative scan pulses which are sequentially supplied to the scan lines SL1 to SL3n and positive data signals which are supplied to the data lines DL1 to DLm/3. On the other hand, light is not generated in a pixel cell PE to which a reverse voltage is applied by a high voltage supplied to the scan lines SL1 to SL3n.

The pixel cells PE are arranged in a horizontal direction, and the RGB pixel cells are repeatedly arranged in a vertical direction. The pixel cell PE, as shown in FIG. 4, switches signals such as a scan signal supplied from the scan lines SL1 to SL3n, a data signal supplied from the data lines DL1 to DLm/3, a high potential voltage VDD supplied from the outside and a low potential voltage VSS by use of a pixel drive circuit 130, thereby controlling the light of the light-emitting diode EL. Such a pixel drive circuit 130 is composed of at least one thin film transistor.

The scan signals are sequentially supplied to the scan lines SL1 to SL3n from the scan driver 118 for each one line. The number of scan lines SL1 to SL3n corresponds to the vertical resolution. For example, for an EL display panel having a 176×220 resolution, the RGB pixel cells PE are arranged vertically so that the vertical resolution has a resolution of 220×3(RGB)=660, thus there are 660 scan lines SL1 to SL3n.

Figure 1:
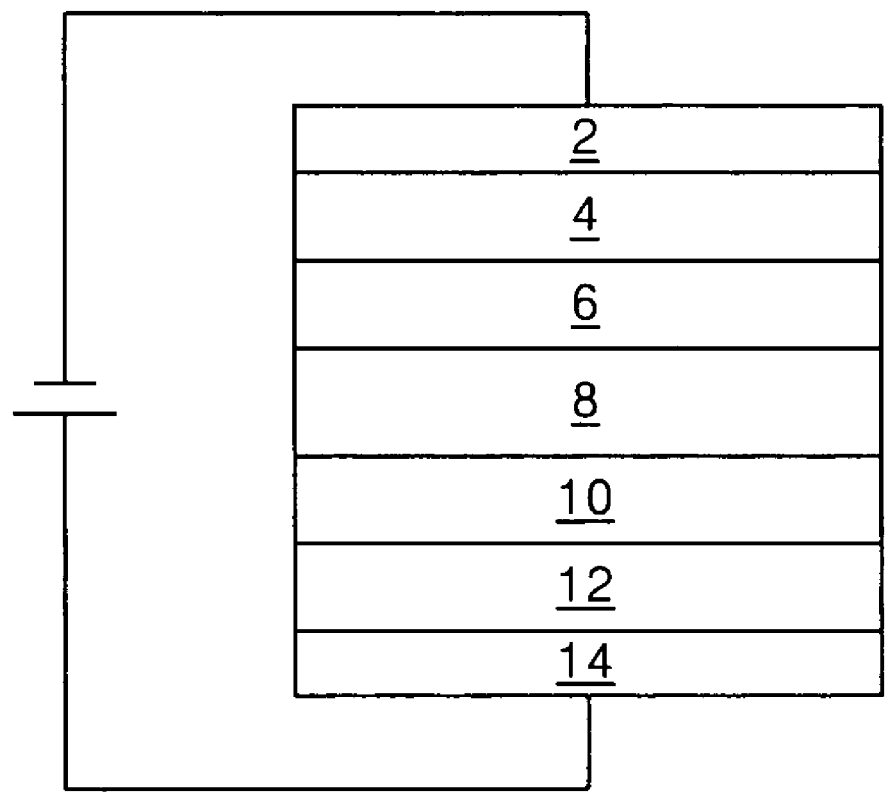
FIG. 1 illustrates a general organic light-emitting diode.
Figure 2:
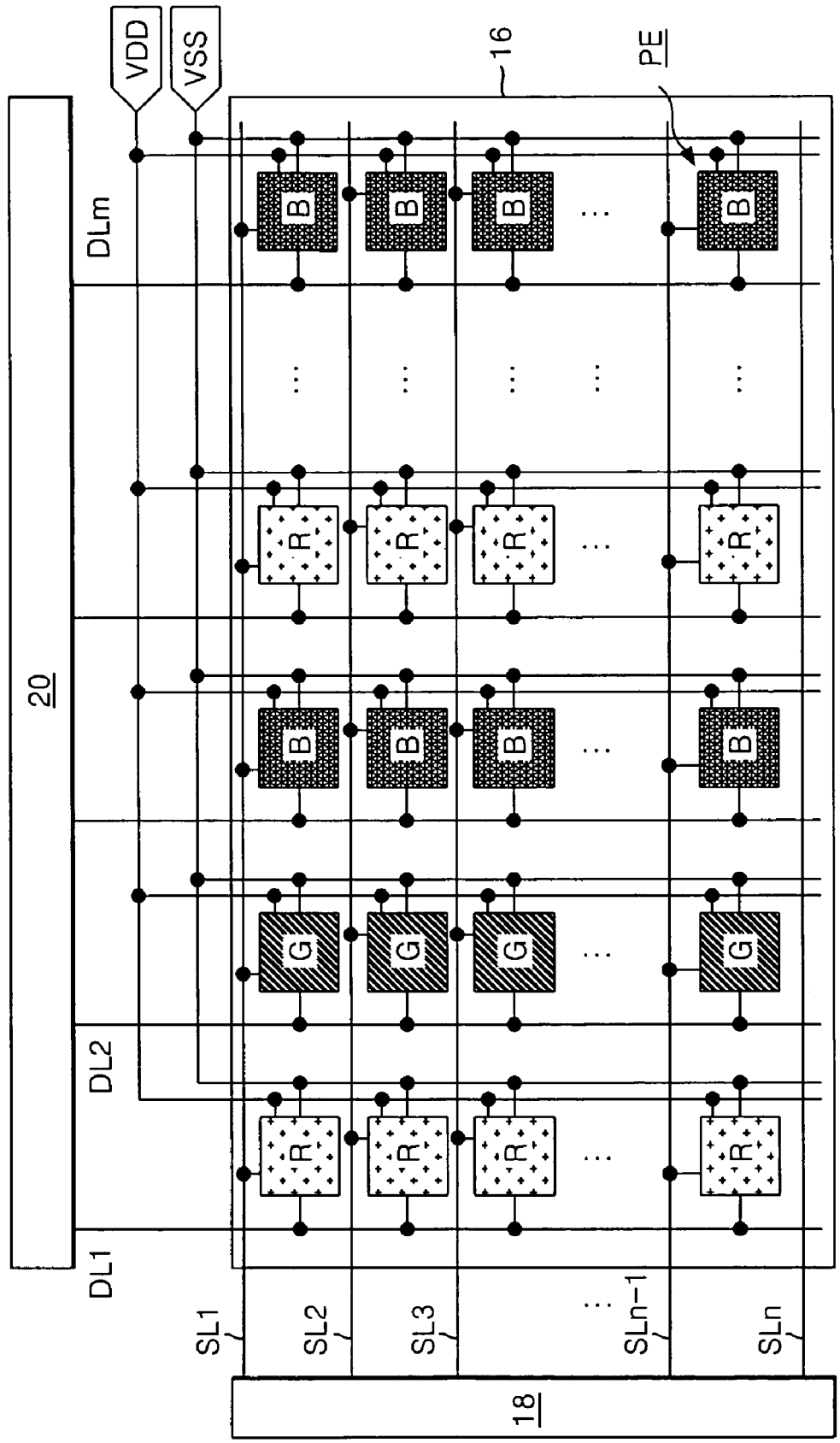
FIG. 2 is a circuit diagram of a conventional display.

The data lines DL1 to DLm/3 receive a video data signal inputted from the data driver 120 while the scan signal is sequentially supplied to the scan lines SL1 to SL3n. The number of data lines DL1 to DLm/3 corresponds to a horizontal resolution. Using the above example, for an EL display panel having a 176×220 resolution, the RGB pixel cells PE are arranged vertically, the horizontal resolution has a resolution of 176, thus there are 176 data lines DL1 to DLm/3. When comparing the number of the data lines with that of the related art, the related art has the pixel cells PE arranged in order of R, G, B in a horizontal direction and the pixels of the same color arranged in a vertical direction, as shown in FIG. 2, in comparison with the present invention where the pixel cells PE are arranged in order of R, G, B vertically and the pixels of the same color are arranged horizontally. Because of this, the number of data lines is reduced to ⅓ that of the related art, and the number of output channels of the data driver can be similarly reduced.

The scan driver 118 is connected to each of the scan lines SL1 to SL3n to supply the scan signal. The scan driver 118 has the RGB pixel cells arranged vertically, thereby having the channels which correspond to the increased scan lines SL1 to SL3n.

The data driver 120 is connected to each of the data lines DL1 to DLm/3 to supply the video data signal from the outside to the data lines DL1 to DLm/3.

The active matrix type EL display device according to the first embodiment of the present invention having such a structure can reduce the number of data lines DL1 to DLm/3 to ⅓ that of the related art. Thus it is easier to connect the data driver 120 to the EL display panel 116 even though the number of data lines DL1 to DLm/3 has been increased for high resolution.

FIG. 5 is a circuit diagram of an active matrix type EL display device according to a second embodiment of the present invention.

Referring to FIG. 5, the active matrix type EL display device according to the second embodiment of the present invention includes scan lines SL1 to SL3n to which a scan signal is supplied; data lines DL1 to DLm/3 arranged to cross the scan lines SL1 to SL3n ; an EL display panel 216 where RGB pixel cells PE are vertically arranged at each of the crossing areas of the scan lines SL1 to SL3n and the data lines DL1 to DLm/3; a scan driver 218 formed on the same surface as the scan lines SL1 to SL3n for driving the scan lines SL1 to SL3n; and a data driver 220 for driving the data lines DL1 to DLm/3.

Each pixel cell PE is arranged in the crossing area of the scan line SL1 to SL3n and the data line DL1 to DLm/3 and emits light in response to a signal from each of the lines, thereby realizing a picture. Specifically, light is emitted in response to negative scan pulses which are sequentially supplied to the scan lines SL1 to SL3n and positive data signals which are supplied to the data lines DL1 to DLm/3. On the other hand, light is not generated in a pixel cell PE to which a reverse voltage is applied by a high voltage supplied to the scan lines SL1 to SL3n.

The pixel cells PE are arranged in a horizontal direction, and the RGB pixel cells are repeatedly arranged in a vertical direction. The pixel cell PE, as shown in FIG. 4, switches signals such as a scan signal supplied from the scan lines SL1 to SL3n, a data signal supplied from the data lines DL1 to DLm/3, a high potential voltage VDD supplied from the outside and a low potential voltage VSS by use of a pixel drive circuit 130, thereby controlling the light of the light-emitting diode EL. Such a pixel drive circuit 130 is composed of at least one thin film transistor.

The scan signals are sequentially supplied to the scan lines SL1 to SL3n from the scan driver 218 for each one line. The number of scan lines SL1 to SL3n corresponds to the vertical resolution. For example, for an EL display panel having a 176×220 resolution, the RGB pixel cells PE are arranged vertically so that the vertical resolution has a resolution of 220×3(RGB)=660, thus there are 660 scan lines SL1 to SL3n.

The data lines DL1 to DLm/3 receive a video data signal inputted from the data driver 220 while the scan signal is sequentially supplied to the scan lines SL1 to SL3n. The number of data lines DL1 to DLm/3 corresponds to a horizontal resolution. For example, for an EL display panel having a 176×220 resolution, the RGB pixel cells PE are arranged vertically, the horizontal resolution has a resolution of 176, thus there are 176 data lines DL1 to DLm/3.

The scan driver 218 is embedded on a substrate where the scan lines SL1 to SL3n are formed, and the scan driver is connected to each of the scan lines SL1 to SL3n to supply the scan signal. The scan driver 218 has the RGB pixel cells arranged vertically, thereby having the channels which correspond to the increased scan lines SL1 to SL3n.

More specifically, the scan driver 218 includes a shift register SR1 to SR3n connected to each of the scan lines SL1 to SL3n; a level shifter L/S for shifting a voltage level of the scan signal supplied from the outside to supply to each of the shift register SR1 to SR3n; and a clock CLK for controlling a signal supply of the level shifter L/S. The scan driver 218 according to the embodiment of the present invention having such a structure shifts the level of the scan signal supplied from the outside in accordance with the control of the clock CLK to convert the scan signal to have a signal size which is substantially used in the EL display panel 216. The signal converted by the level shifter L/S is delayed through each of the shift register SR1 to SR3n to be sequentially supplied to each of the scan lines SL1 to SL3n. Herein, a thin film transistor within the scan driver 218 and a thin film transistor included in the pixel drive circuit 130 for driving the pixel cell PE can be formed at the same time.

The data driver 220 is connected to each of the data lines DL1 to DLm/3 to supply the video data signal from the outside to the data lines DL1 to DLm/3.

The active matrix type EL display device according to the second embodiment of the present invention having such a structure can reduce the number of data lines DL1 to DLm/3 to ⅓ in comparison with the related art, thus it becomes easier to connect the data driver 220 to the EL display panel 216 even though the number of data lines DL1 to DLm/3 are increased for high resolution. In addition, the scan driver 218 is directly formed on the substrate to reduce the manufacturing cost and the manufacturing unit price can be reduced by simplifying the fabricating process.

The EL display device according to the embodiment of the present invention forms an active layer of the thin film transistor by use of amorphous silicon or poly silicon. Amorphous silicon has a relatively good uniformity and stable characteristics. Poly silicon has high charge mobility, thereby permitting the pixel density of the poly silicon type EL display device to increase. Further, the drive circuits using a relatively rapid response speed are mounted on the EL display panel to reduce the manufacturing unit price.

As described above, the present EL display device arranges the RGB pixel cells vertically to reduce the number of data lines. Accordingly, the number of data lines connected to the data driver is decreased to ⅓ of that of the related art even though the number of data lines is increased for high resolution. Thus it becomes easier to connect the data driver to the data lines. Further, the present EL display device forms the scan driver on the same substrate as the portion of the display where the scan lines are formed. Thus, use of additional circuitry for connecting the scan line to the scan driver may be avoided. Accordingly, the EL display device according to the embodiment of the present invention can rapidly supply the scan signal to the scan line, i.e., has a high response speed, and can reduce the manufacturing cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic light-emitting diode display device, comprising:
   a plurality of data lines and a plurality of scan lines which cross each other;
   a plurality of pixel cells arranged in a matrix in pixel areas between the data lines and the scan lines, the pixel cells containing organic electro-luminescence diodes, the pixel cells arranged in different colors in a vertical direction and in the same color in a horizontal direction;
   a data driver operative to supply data to the data lines; and
   a scan driver operative to supply a scan signal to the scan lines.

2. The organic light-emitting diode display device according to claim 1, wherein
   the pixel cells include red pixel cells, green pixel cells, and blue pixel cells, and
   the pixel cells are repeatedly arranged in the vertical direction in order: red, green, and blue.

3. The organic light-emitting diode display device according to claim 1, wherein the scan driver includes:
   a level shifter operative to change a signal level of a scan signal inputted from outside;
   a shift register operative to sequentially supply a signal outputted from the level shifter to the scan lines; and
   a control signal operative to control the level shifter and the shift register.

4. The organic light-emitting diode display device according to claim 1, further comprising a pixel driving thin film transistor operative to drive the pixel cell, wherein the pixel driving thin film transistor and a thin film transistor included in the scan driver each comprise at least one of a poly silicon layer or an amorphous silicon layer.

5. The organic light-emitting diode display device according to claim 1, wherein the display has a resolution of m×n, p different colors of pixel cells are present in the display, the data driver has m/p outputs, and the scar driver has p×n outputs.

6. The organic light-emitting diode display device according to claim 5, wherein p=3.

7. The organic light-emitting diode display device according to claim 6, wherein the colors of the pixel cells are red, green, and blue.

8. The organic light-emitting diode display device according to claim 5, wherein the number of outputs from the data and scan drivers correspond one-to-one with the number of pixel cells in the horizontal and vertical directions, respectively.

9. The organic light-emitting diode display device according to claim 1, wherein each pixel cell comprises a pixel driving thin film transistor disposed such that the organic electro-luminescence diode is connected to the associated scan and data lines through the pixel driving thin film transistor.

10. An organic light-emitting diode display device, comprising:
    a display panel which has a plurality of data lines and a plurality of scan lines crossing each other and a plurality of pixel cells arranged in a matrix in pixel areas between the data lines and the scan lines, the pixel cells containing organic electro-luminescence diodes,
    wherein the pixel cells are arranged in different colors in a vertical direction and in the same color in a horizontal direction.

11. The organic light-emitting diode display device according to claim 10, wherein the display has a resolution of m×n, p different colors of pixel cells are present in the display, the number of pixel cells in the horizontal direction is m/p, and the number of pixel cells in the vertical direction is p×n.

12. The organic light-emitting diode display device according to claim 11, wherein p=3.

13. The organic light-emitting diode display device according to claim 12, wherein the colors of the pixel cells are red, green, and blue.

14. A driving method of an organic light-emitting diode display device, the method comprising:
   providing a display panel having a plurality of data lines and a plurality of scan lines crossing each other to form a plurality of pixel cells, the pixel cells containing organic electro-luminescence diodes, the pixel cells arranged in different colors in a vertical direction and in the same color in a horizontal direction;
   supplying a data to the data lines; and
   supplying a scan signal to the scan lines of the pixel cells.

15. The driving method according to claim 14, wherein:
   the pixel cells include red pixel cells, green pixel cells, and blue pixel cells, and
   the pixel cells are arranged in the vertical direction in order: red, green, and blue.

16. The method according to claim 14, wherein the display has a resolution of m×n, p different colors of pixel cells are present in the display, the data driver has m/p outputs, and the scan driver has p×n outputs.

17. The method according to claim 16, wherein p=3.

18. The method according to claim 17, wherein the colors of the pixel cells are red, green, and blue.

19. The method according to claim 16, wherein the number of outputs from the data and scan drivers correspond one-to-one with the number of pixel cells in the horizontal and vertical directions, respectively.

* * * * *